US006995051B1

(12) United States Patent
Furukawa et al.

(10) Patent No.: US 6,995,051 B1
(45) Date of Patent: Feb. 7, 2006

(54) IRRADIATION ASSISTED REACTIVE ION ETCHING

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,200

(22) Filed: Oct. 28, 2004

(51) Int. Cl.
*H01L 21/00* (2006.01)

(52) U.S. Cl. ............... 438/157; 438/283; 438/299; 438/308; 438/535

(58) Field of Classification Search ........ 438/510–532, 438/141–308, 795–799
See application file for complete search history.

(56) References Cited

U.S. PATENT DOCUMENTS

| | | | |
|---|---|---|---|
| 4,181,538 A | | 1/1980 | Narayan et al. |
| 4,234,356 A | | 11/1980 | Auston et al. |
| 4,243,433 A | | 1/1981 | Gibbons |
| 5,158,897 A | * | 10/1992 | Sato et al. ............. 438/515 |
| 5,354,696 A | * | 10/1994 | Oostra et al. ............. 438/515 |
| 5,385,633 A | | 1/1995 | Russell et al. |
| 5,840,592 A | * | 11/1998 | Russell et al. ............. 438/795 |
| 6,403,434 B1 | * | 6/2002 | Yu ............. 438/300 |
| 6,812,075 B2 | * | 11/2004 | Fried et al. ............. 438/157 |
| 6,864,164 B1 | * | 3/2005 | Dakshina-Murthy et al. .... 438/585 |
| 2002/0164884 A1 | * | 11/2002 | Lishan ............. 438/739 |
| 2003/0153905 A1 | | 8/2003 | Edwards et al. |

OTHER PUBLICATIONS

Armacost, M. D. et al., "Excimer Laser-Assisted Etching of Polysilicon at 193 nm", Journal of Materials Research, vol. 2, No. 6, Nov./Dec. 1987, pp. 895-901.
Joubert, O. et al., "Plasma Polymerized Methylsilane. III. Process Optimization for 193 nm Lithography Applications," Journal of Vacuum Science Technology B, vol. 18, No. 2, Mar./Apr. 2000, pp. 793-798.

* cited by examiner

*Primary Examiner*—Savitri Mulpuri
(74) *Attorney, Agent, or Firm*—Lisa U. Jaklitsch; Hoffman, Warnick & D'Alessandro LLC

(57) ABSTRACT

Etching methods and apparatus are disclosed for irradiation assisted reactive ion etching. One embodiment includes providing a substrate having a patterned mask thereon with an exposed area; forming an etch area in the substrate by implanting the exposed area of the substrate with a reactive species; and (laser) irradiating the etch area to volatilize the etch area. The methods modify etch conditions such that they approximate an 'atomic layer etching' process, in which thin layers of substrate are selectively and successively etched.

9 Claims, 11 Drawing Sheets

IRRADIATION ASSISTED REACTIVE ION ETCHING

BACKGROUND OF INVENTION

1. Technical Field

The present invention relates generally to semiconductor device fabrication, and more particularly, to methods and apparatus for irradiation assisted reactive ion etching.

2. Related Art

Etch uniformity continues to be an important concern in the semiconductor device fabrication industry. As semiconductor devices are further miniaturized, etch uniformity requirements are also scaled proportionately. Unfortunately, current etch processes are incapable of achieving the required image tolerance values necessary for continued scaling. New challenges presented by smaller scale semiconductor devices exist in a number of forms. In one example, finFET devices might be used to enhance device current while reducing leakage values. The width of the finFET silicon mandrel is a critical parameter for the control of finFET device characteristics. Conventionally, the mandrel is formed with a long silicon etch, which can be sensitive to pattern factors, loading factors, and across wafer variations.

One common etching process is reactive ion etching (RIE). RIE processes often exhibit loading and pattern sensitivities that degrade the etch uniformity. In particular, conventional RIE processing requires plasma polymer passivation to protect sidewalls of any etched silicon structure during the etch process. The plasma polymer passivation processes typically exhibit pattern loading and pattern pitch sensitivities, which induce linewidth variation within a chip and across a substrate. One area in which this problem presents a challenge is in forming a fin structure of a finFET because the fin structure requires a deep etch of silicon, and also requires very uniform image width across a chip and across a wafer, independently of pattern density or pattern pitch. Conventionally, changes to tool configurations have been used to modify or enhance RIE etch uniformity. Tool configurations may include, for example, electrode types and powers, gas flow distributions, gas pressures, etc. Unfortunately, it is unlikely that tool configuration changes will allow for continued scaling progression for RIE processing. In another approach, optical etch processes have been used in the presence of reactive gases to etch substrates. However, these techniques are also unlikely to be able to be used with the next generation of smaller scale semiconductor devices. In particular, these etching processes are not directional, and accordingly, not as precise as required.

In view of the foregoing, a new etch method with improved etch uniformity during the formation of structures such as finFETs is desired.

SUMMARY OF THE INVENTION

The invention includes etching methods and apparatus for irradiation assisted reactive ion etching. One embodiment includes providing a substrate having a patterned mask thereon with an exposed area; forming an etch area in the substrate by implanting the exposed area of the substrate with a reactive species; and (laser) irradiating the etch area to volatilize the etch area. The methods modify etch conditions such that they approximate an 'atomic layer etching' process, in which thin layers of substrate are selectively and successively etched.

A first aspect of the invention includes a method for etching to form a semiconductor structure, the method comprising the steps of: providing a substrate having a patterned mask thereon with an exposed area; forming an etch area in the substrate by implanting the exposed area of the substrate with a reactive species; and irradiating the etch area to volatilize the etch area.

A second aspect of the invention include an etching apparatus for a semiconductor structure in a substrate having a patterned mask thereon with an exposed area, the apparatus comprising: means for forming an etch area in the substrate by implanting the exposed area of the substrate with a reactive species; and means for irradiating the etch area to volatilize the etch area.

A third aspect of the invention is directed to a method for etching to form a semiconductor structure, the method comprising the steps of: providing a substrate having a patterned mask thereon with an exposed area; forming an etch area in the substrate by implanting the exposed area of the substrate with a reactive species to a depth of no greater than 50 Å; irradiating the etch area with a laser to volatilize the etch area; removing byproducts of the irradiating step; and repeating the implanting, irradiating and removing steps until a desired etch amount is achieved.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

With reference to the accompanying drawings, FIGS. 1–5, a method for etching to form a semiconductor structure such as a fin structure of a finFET is illustrated. In a first step, shown in FIG. 1, a substrate 10 is provided having a patterned mask 12 thereon with an exposed area 14. Substrate 10 can be provided as silicon either as bulk silicon or silicon-on-insulator (SOI). In addition, substrate 10 may also be provided as germanium (Ge), silicon germanium (SiGe), III–V compounds such as gallium-arsenic (GaAs) or other semiconductor materials. Mask 12 may include silicon dioxide ($SiO_2$), or silicon nitride ($Si_3N_4$), or any other now known or later developed hard mask material. Mask 12 may have different thickness depending on the structure to be built. For a fin structure of a finFET, mask 12 may have a thickness of no less than approximately 100 nm and no greater than approximately 200 nm. Other thicknesses are also possible.

Mask 12 is patterned in a conventional fashion to form exposed area 14. For example, substrate 10 having mask 12 thereon may be coated with resist (not shown) and imagewise exposed using conventional techniques to create the fin structure pattern in the resist. Conventional reactive ion etch (RIE) processing is used to etch the resist pattern into mask 12. The resist can then be removed, as shown, or, optionally, left in place over mask 12.

Figure 1:
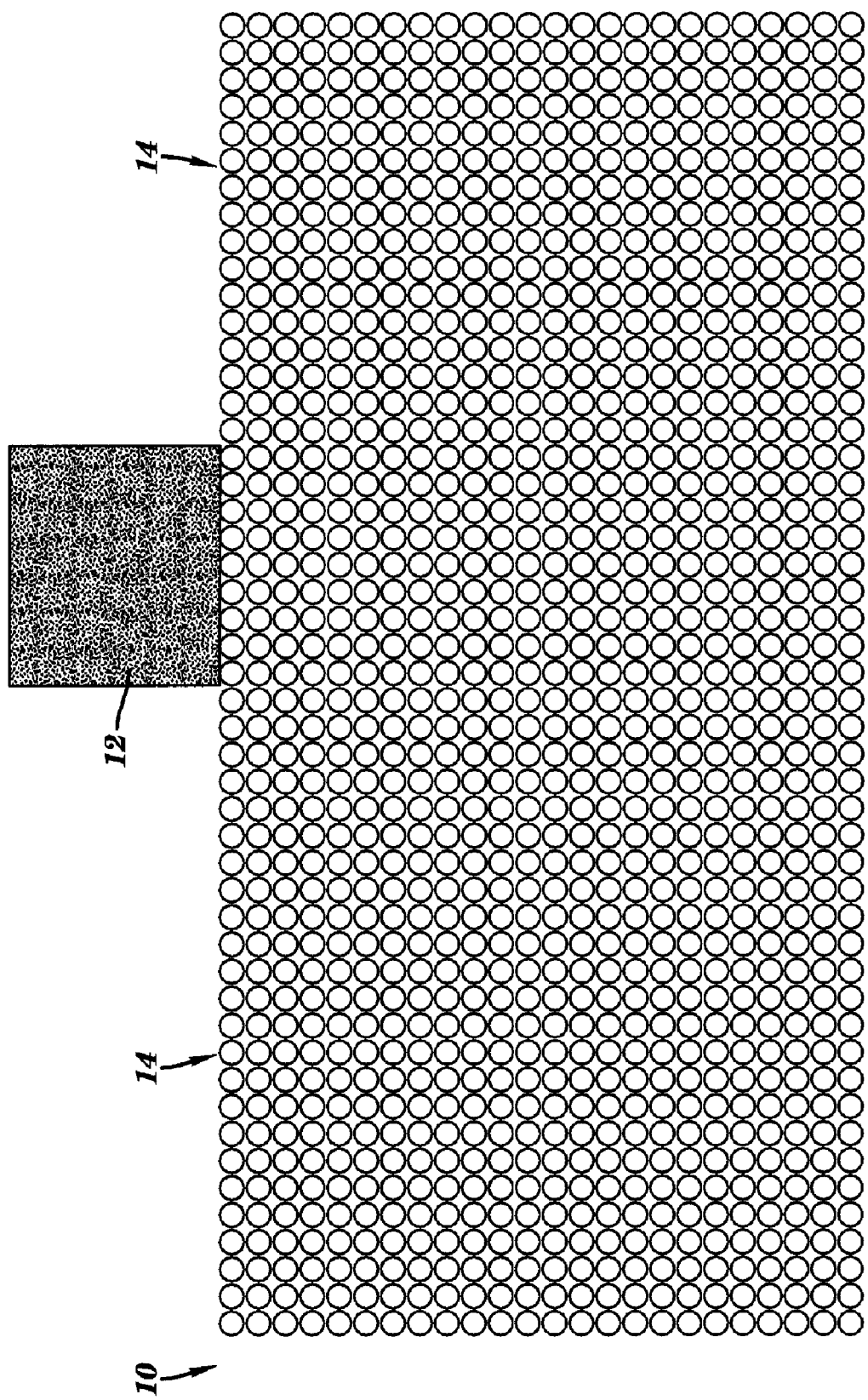
FIGS. 1–5 show a single pass of an etching method according to one embodiment of the invention.
Figure 2:
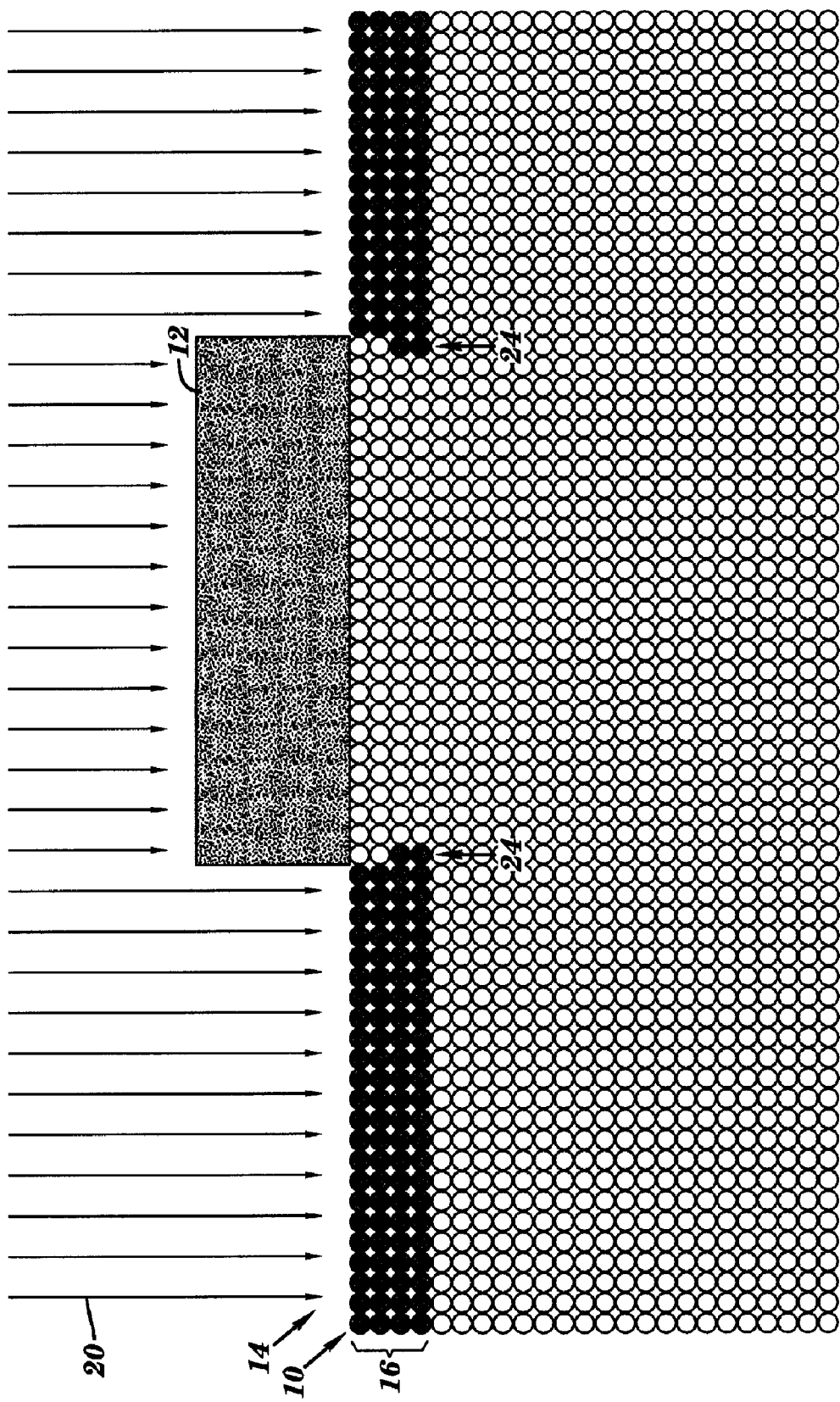
Figure 4:
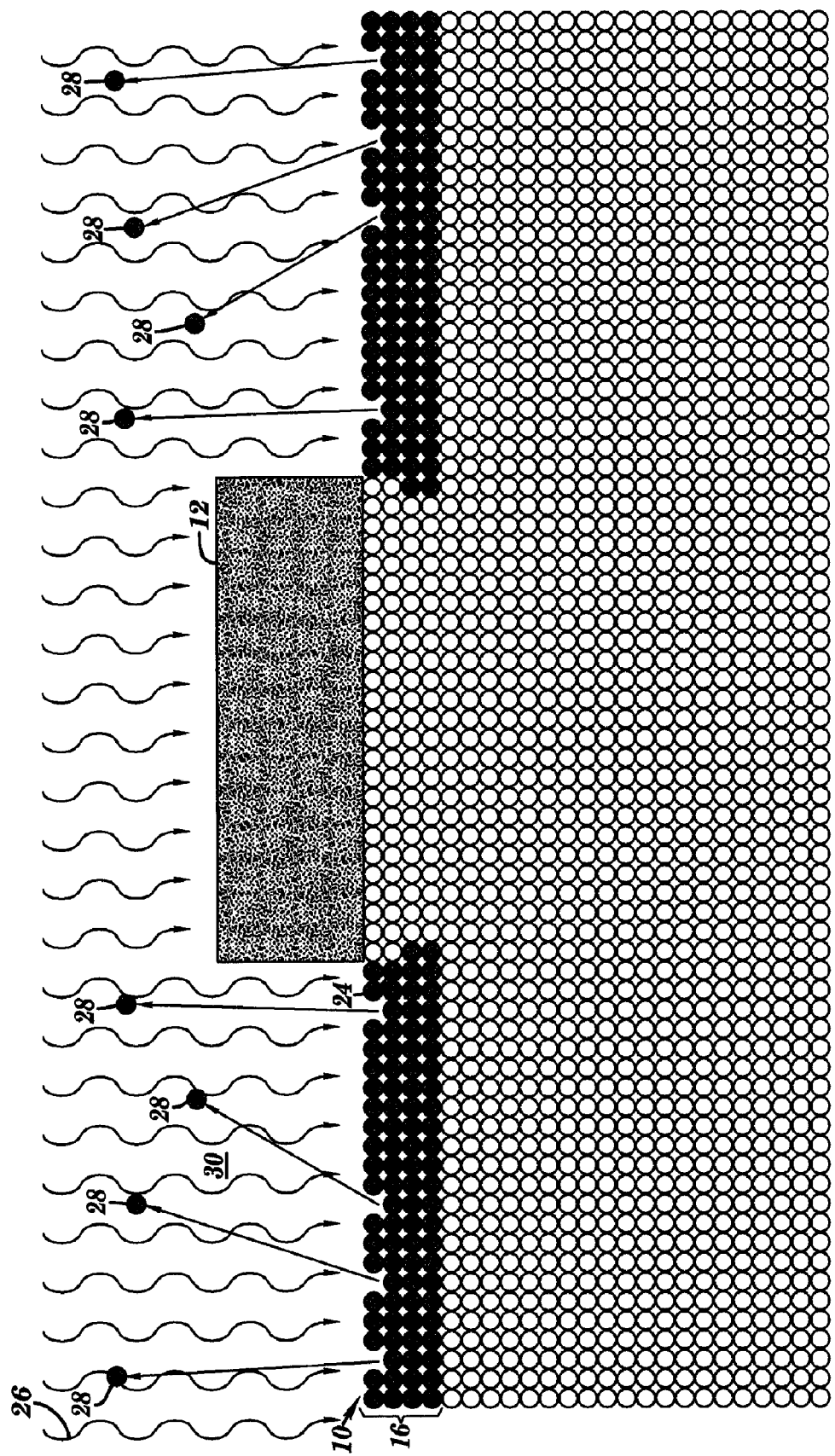

Next, as shown in FIG. 2, an etch area 16 is formed in substrate 10 by implanting exposed area 14 of substrate 10 with a reactive species 20. Reactive species 20 may include fluorine (F), chlorine (Cl), nitrogen tri-flouride ($NF_3$), sulfur hexa-fluoride ($SF_6$) or boron tri-fluoride ($BF_3$). In addition, hydrogen (H) may also be used, however, this is less preferred because it creates less selectivity for etching between mask 12 and etch area 16. In one embodiment, implanting extends to a depth of no greater than approximately 50 Å, but the optimum depth may vary depending on the type of species implanted. For example, hydrogen (H) may be implanted to greater depths than fluorine (Fl) or chlorine (Cl). As implanting proceeds, reactive species 20, e.g., fluorine, is chemisorbed into the silicon of exposed area 14 by virtue of the very strong silicon-fluorine bond. Some reactive species may be chemisorbed in an area 24 under mask 12, e.g., to a few atomic layers. The silicon dioxide or silicon nitride of mask 12 is less reactive to the reactive species due to the difficulty of breaking the silicon-oxygen (Si—O) bond or the silicon-nitrogen (Si—N) bond. The implant could be performed, for example, in any conventional immersion ion implant tool such as those available from Applied Materials or Varian Semiconductor Equipment Associates. In one embodiment, the implant occurs in the presence of a gas 30 (FIG. 4) including argon (Ar) and fluoro-carbon or chloro-carbon or bromo-carbon gas. The argon (Ar) acts as a sputtering agent to eject silicon (Si) species from the substrate surface. At the same time, the fluorocarbon, chloro-carbon or bromo-carbon plasma reacts with the ejected silicon species to create volatile byproducts 28 (FIG. 4).

Figure 3:
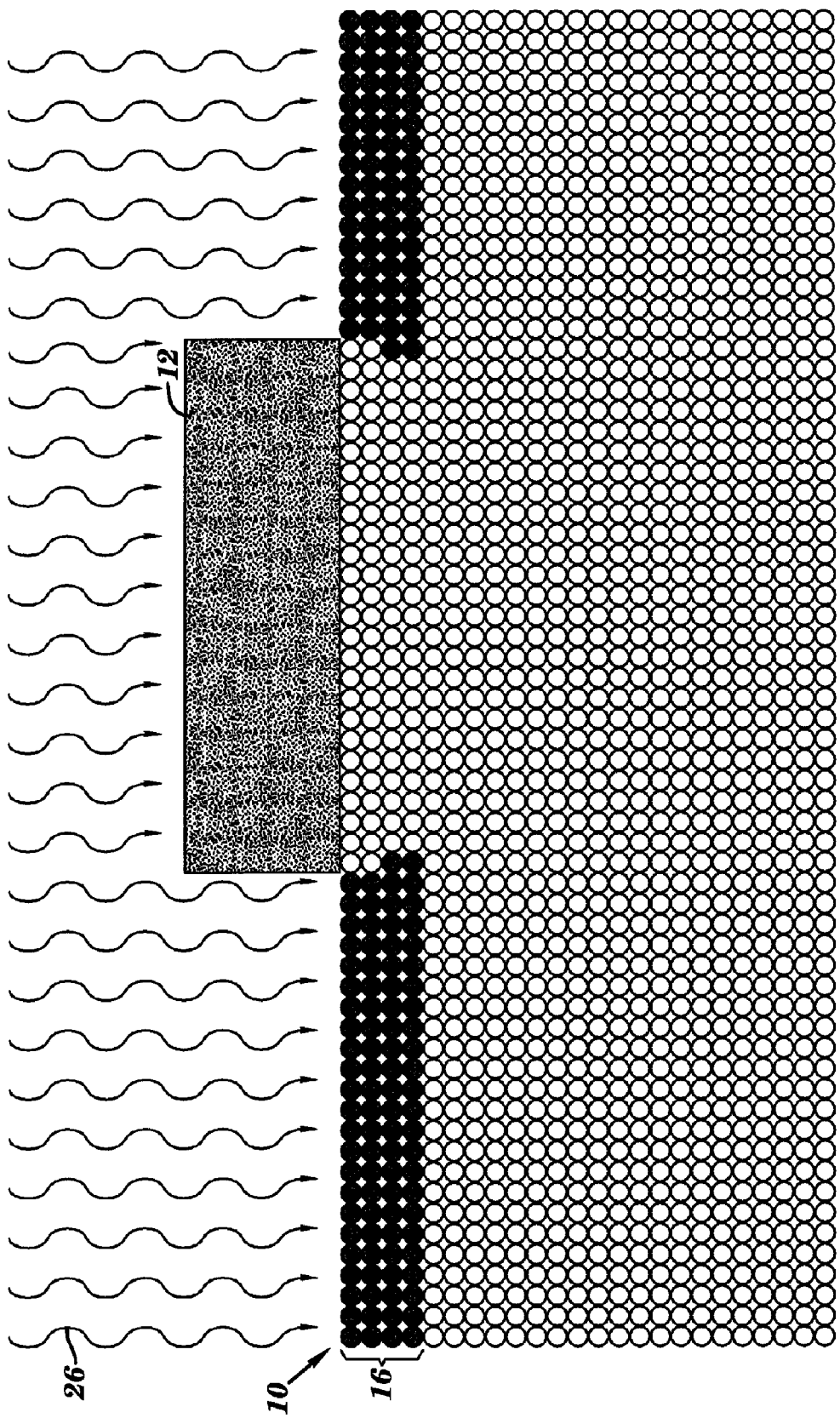

Next, as shown in FIG. 3, etch area 16 is irradiated 26 to volatilize the etch area. This step preferably occurs in a vacuum. As shown in FIG. 4, irradiation 26 provides energy to break silicon—silicon (Si—Si) bonds of silicon substrate 12, and chemically activates and volatilize the surface byproducts 28 such as silicon tetra-flouride ($SiF_4$). Where substrate 12 includes germanium (Ge), silicon-germanium (SiGe) or gallium-arsenic (GaAs), the fluorides and chlorides of these materials are also sufficiently volatile to allow etching thereof. In one preferred embodiment, irradiation 26 may include laser irradiation. The laser may have a wavelength of approximately 193 nm, which is suitable for this purpose as silicon—silicon (Si—Si) bonds are readily cleaved by energy at this wavelength. An exposure dose value of no less than approximately 50 $mj/cm^2$ and no greater than approximately 5000 $mj/cm^2$ has been found sufficient for this wavelength of laser. This step preferably occurs after the implant step of reactive species 20, but could be completed simultaneously. In this fashion, reactive species 20 can be volatilized without the risk of sidewall etching due to optical activation of the sidewall. However, the irradiation may also occur during the implant step, but due to the presence of reactive species 20, which might allow sidewall etching due to scattering thereof from exposed area 14, this is not preferred.

Figure 5:
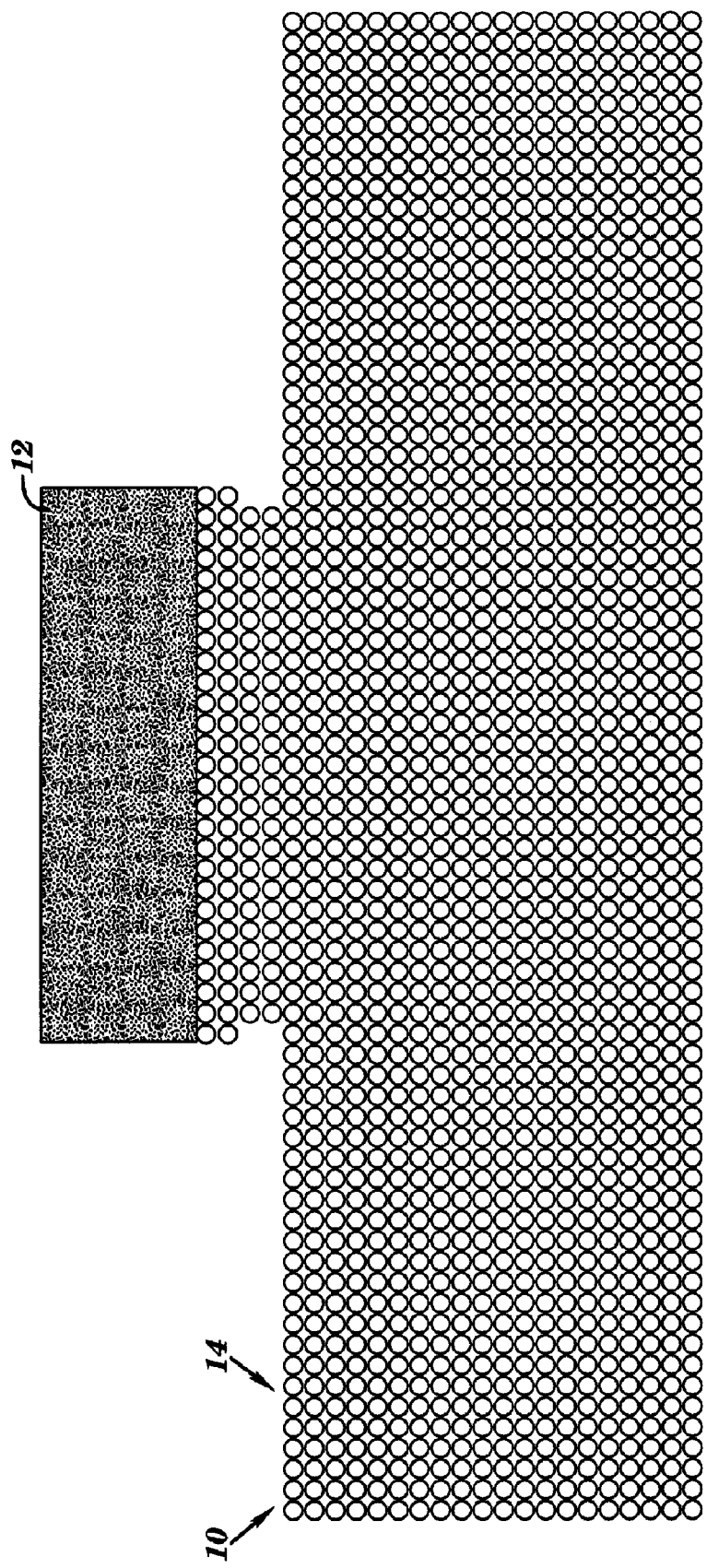
Figure 6:
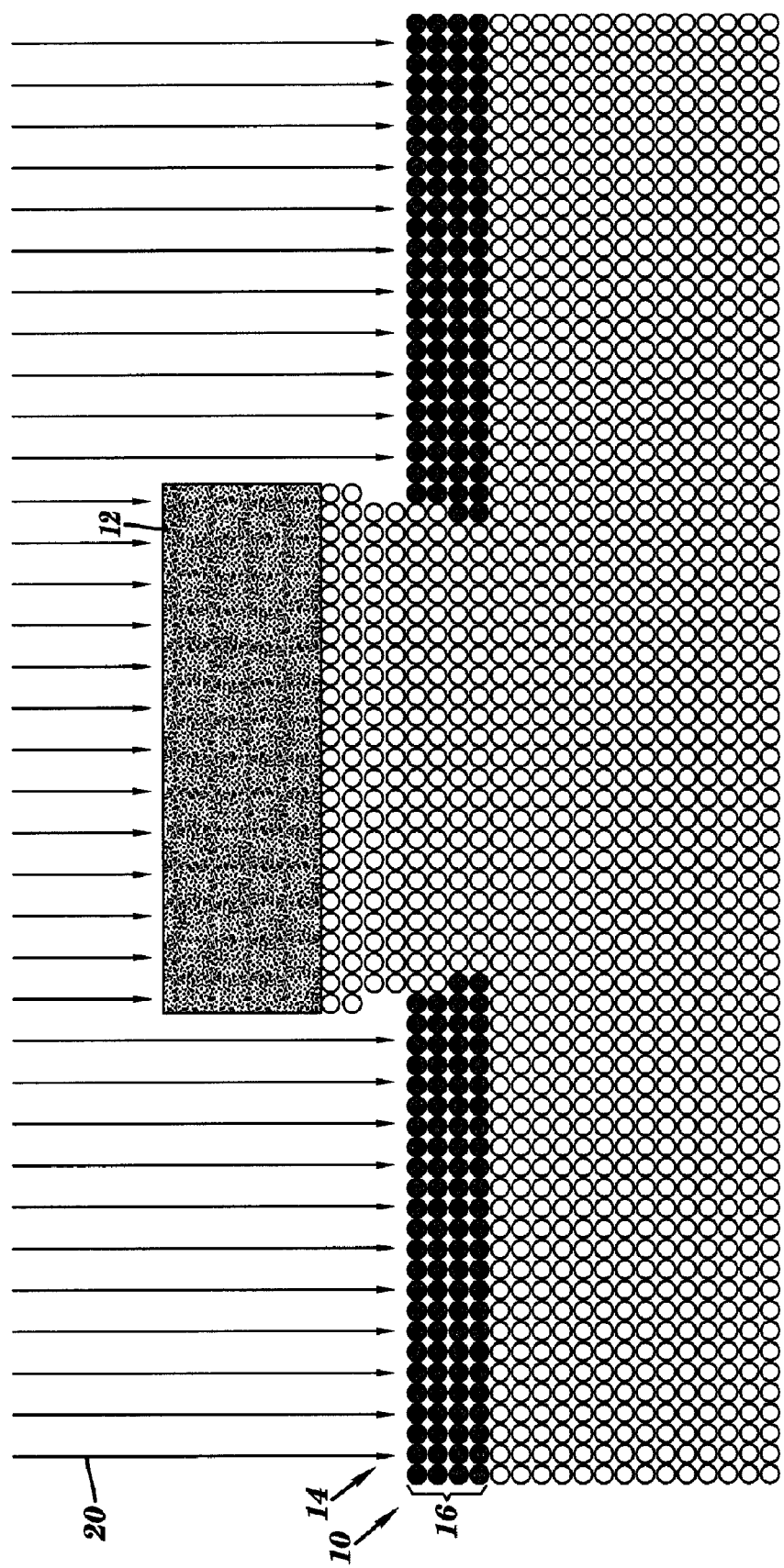
FIGS. 6–10 show subsequent passes of the etching method of FIGS. 1–5.
Figure 7:
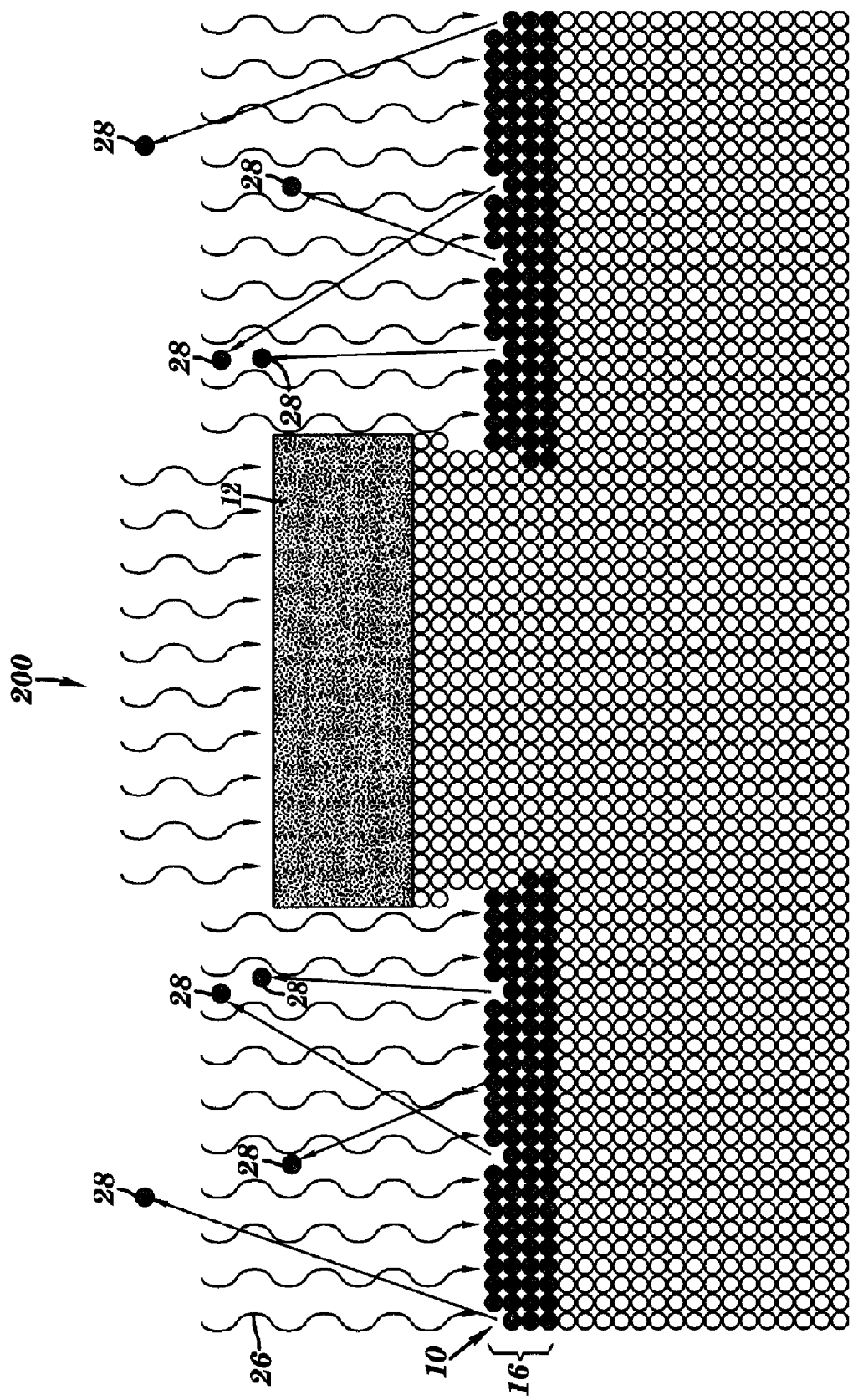
Figure 8:
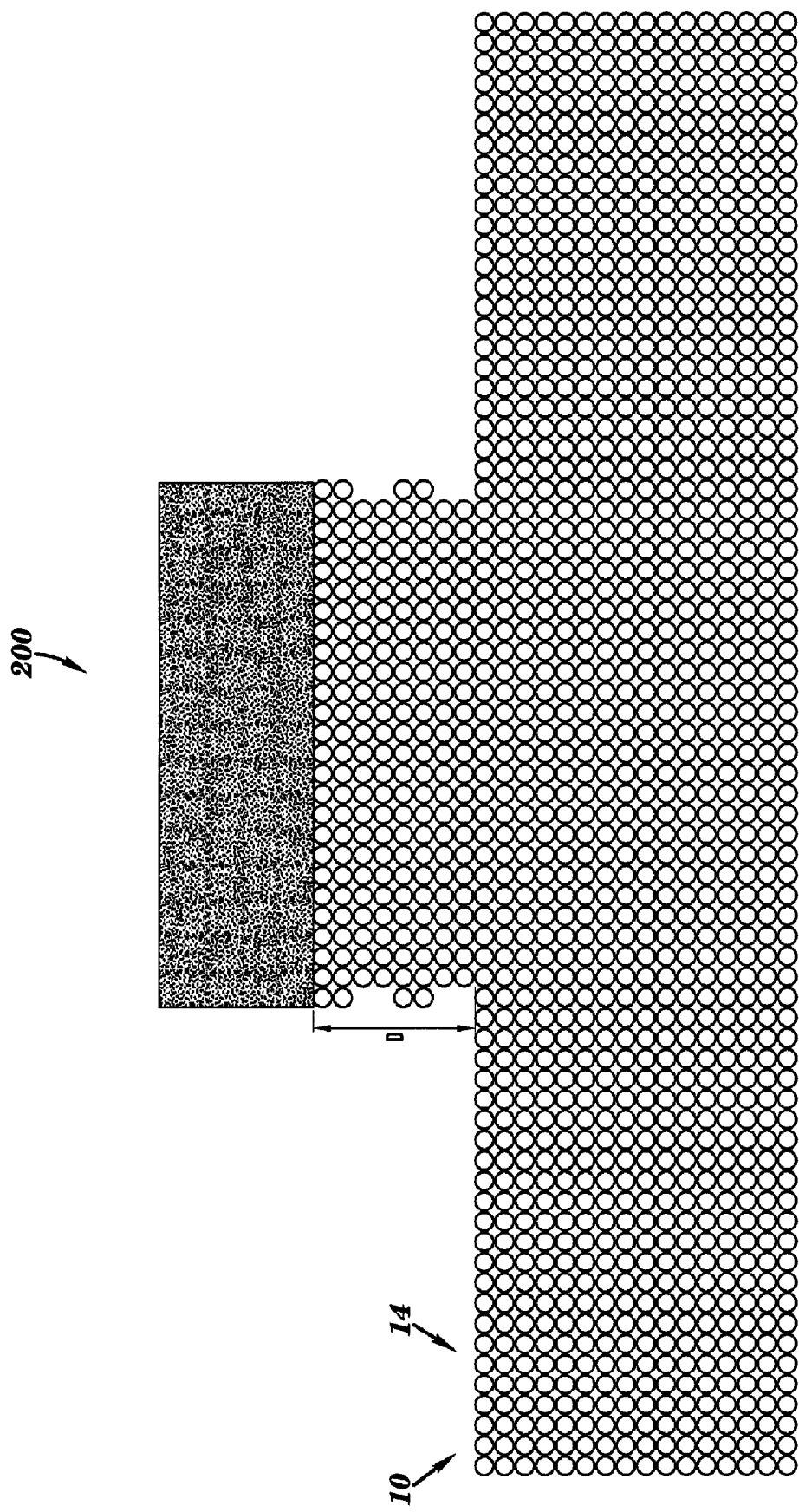
Figure 9:
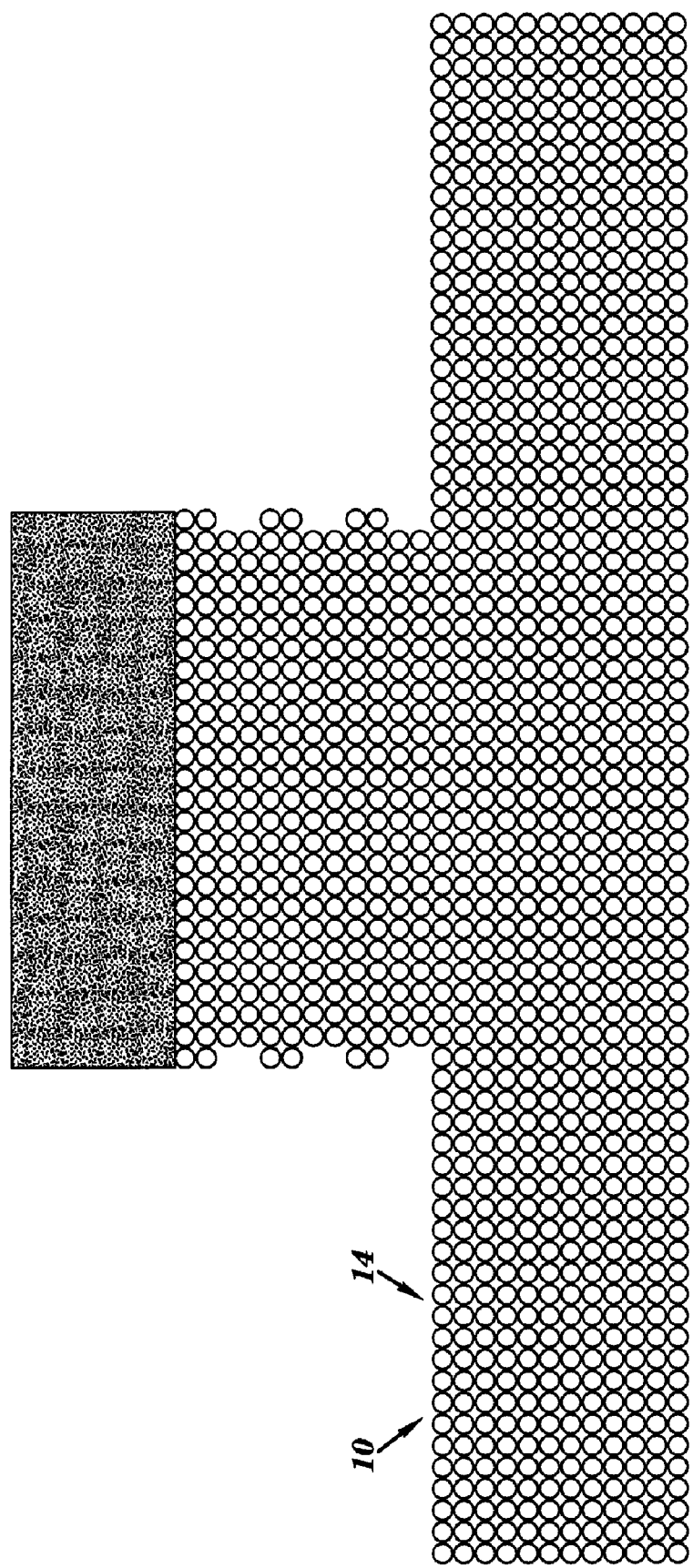
Figure 10:
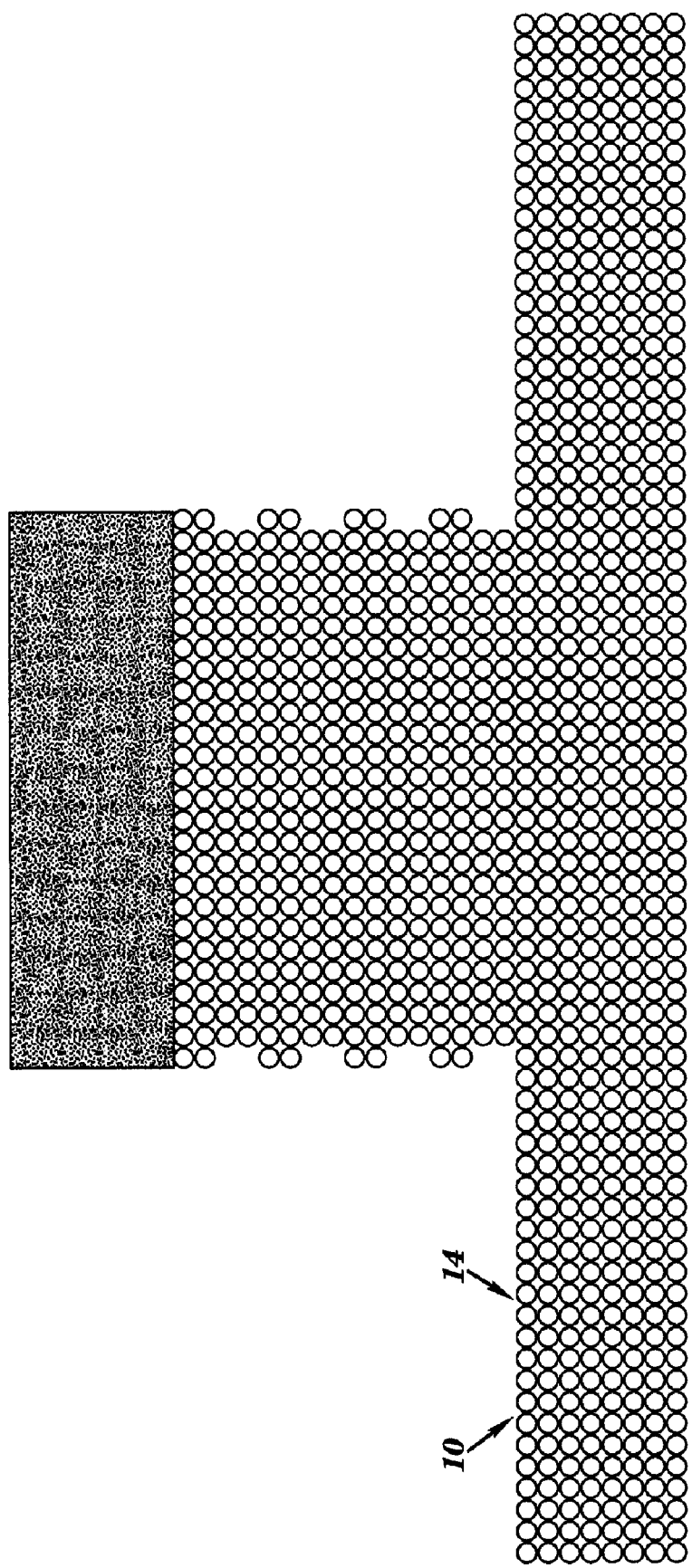

FIG. 5 shows results of one pass of etching. As shown in FIG. 5, byproducts 28 (FIG. 4) of the irradiating step are removed, e.g., by evacuating an irradiation chamber. As shown, a fresh silicon exposed area 14 of substrate 10 is exposed for further activation by another implant/irradiation. As shown in FIGS. 6–8, the implanting, irradiating and removing steps can be repeated until a desired etch amount D (FIG. 8) is achieved. FIGS. 9–10 illustrate the results of further etching passes. That is, substrate 10 is cycled back into the immersion implant step to activate the top atomic layers (e.g., several angstroms) of exposed area 14 of silicon substrate 10 surface, and then the laser irradiation for chemical activation and vaporization step is repeated.

The method described above can also be applied to define the gate conductor of a planar gate FET. In this case, substrate 10 may be provided as germanium (Ge), silicon-germanium (SiGe), silicon (Si) or other semiconductor materials. In addition, substrate 10 is processed through conventional shallow trench isolation (STI) modules and ion implant modules to form N-well and P-well areas (not shown) of the CMOS device. Gate dielectric (not shown) is formed and gate conductor such as polysilicon (not shown) may then be deposited for the gate conductor, and optionally pre-doped for N and P devices. Polysilicon thickness is typically approximately 50–150 nm thick. The material (gate conductor) in substrate 10 to be etched may be other material such as tungsten (W), rhenium (Re), silicon (Si), germanium (Ge), silicon-germanium (SiGe), tungsten silicide ($WSi_2$), polycrystalline silicon, tantalum nitride (TaN), ruthenium (Ru), or any other suitable conductor. Mask layer such as silicon dioxide ($SiO_2$) or silicon nitride ($Si_3N_4$) or any other suitable material is then deposited over the gate conductor and patterned similarly to the process described for the fin structure formation. The mask may have a thickness of no less than approximately 5 nm and no greater than approximately 100 nm. The sequential implant and laser irradiation for chemical activation and vaporization method is performed to etch the gate conductor similarly to the process described in detail for the fin structure formation. The etch process sequence may stop on gate dielectric for the planar gate.

The above-described method provides for a more uniform etch processing, and finds special advantage relative to forming a fin structure of a finFET. In particular, the method allows for a deep etch of silicon for a fin structure, and provides very uniform image width across a chip and across a wafer, independently of pattern density or pattern pitch. In addition, plasma polymer passivation is not required to protect the sidewalls of the etched silicon structure during the etch process. Accordingly, the typical pattern loading and pattern pitch sensitivities, which induce linewidth variation within a chip and across a substrate, are no longer a problem. The method described above is inherently directional due to the trajectory of the implanted ions and does not rely on sidewall passivation.

Figure 11:
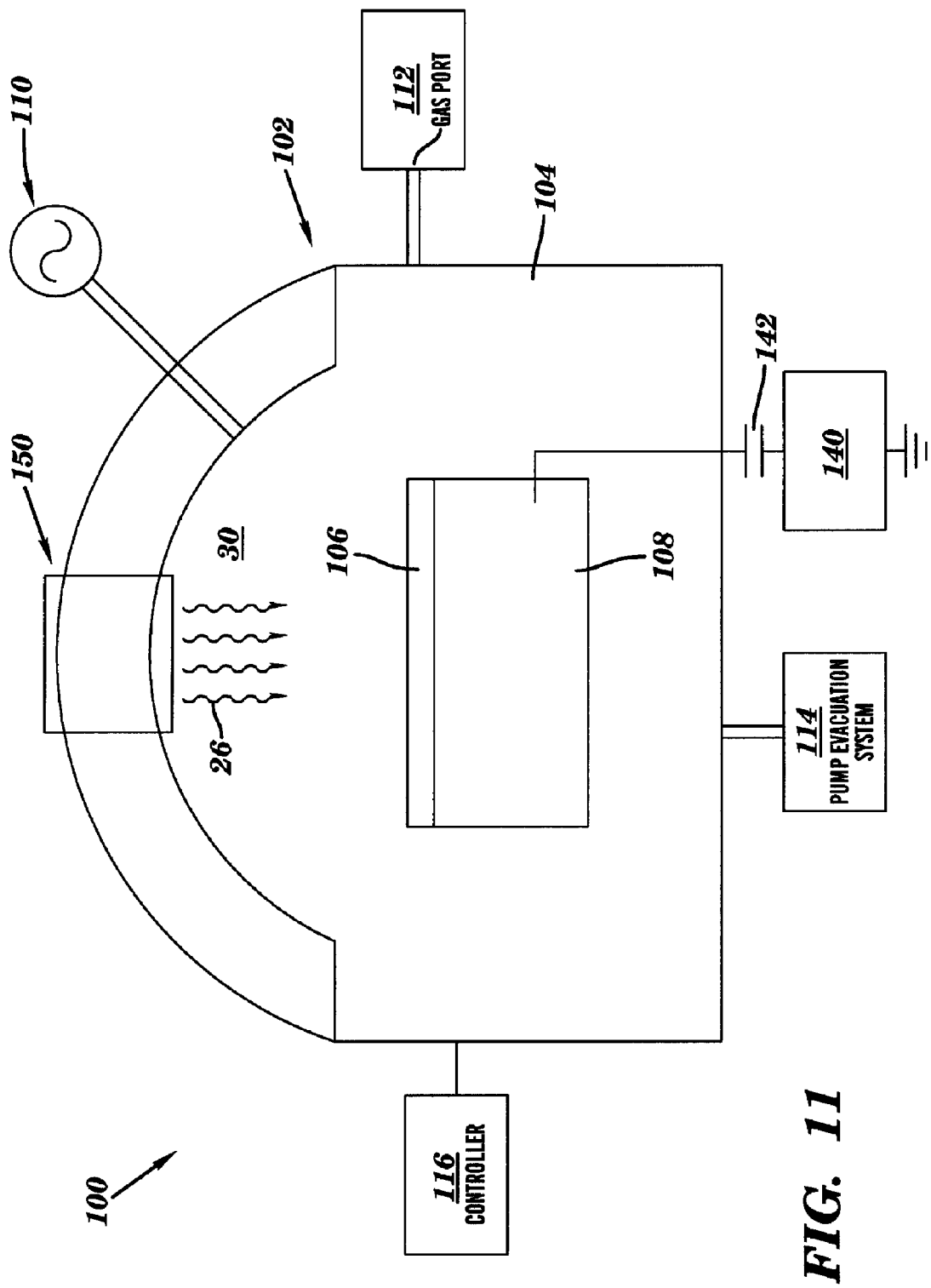
FIG. 11 shows an apparatus for carrying out the etching method of FIGS. 1–10.

As shown in FIG. 11, the invention may also include an etching apparatus 100 for carrying out the above described method. In one embodiment, etching apparatus 100 may include an ion implanter 102 for forming an etch area 16 (FIG. 2) in substrate 10 (FIG. 2) by implanting exposed area 14 (FIG. 2) of substrate 10 with a reactive species. As shown, in one embodiment, ion implanter 102 may include any now known or later developed structure for plasma implanting. Although an immersion-type ion implanter is preferred because of its high dose and low cost of implant, it should be recognized that other ion implanting mechanisms may be used, e.g., an acceleration type ion implanter. Implanting may occur to a depth of no greater than approximately 50 Å, but may vary depending on the type of species implanted, as described above. In one embodiment, immersion ion implanter 102 includes functional components found on any conventional immersion ion implant tool such as those available from Applied Materials or Varian Semiconductor Equipment Associates. For example, immersion ion implanter 102 may include a chamber 104 for positioning a wafer 106 on a cathode 108, a radio-frequency (RF) electro-magnetic wave generator 110, a gas port 112 for providing a source gas 30, a pump evacuation system 114, and a controller 116 for each part. Cathode 108 is connected to a grounded RF power supply 140 through a blocking capacitor 142. As described above, gas port 112 may be configured to introduce a gas including argon (Ar) and fluoro-carbon or chloro-carbon or bromo-carbon gas. In addition to the above structure, etching apparatus 100 also includes an irradiation device 150 such as a laser for irradiating 26 the etch area on the substrate to volatilize the etch area.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for etching to form a semiconductor structure, the method comprising the steps of:
   providing a substrate having a patterned mask thereon with an exposed area;
   forming an etch area in the substrate by implanting the exposed area of the substrate with a reactive species wherein the implanting step occurs in the presence of a gas including argon (Ar) and a selected group consisting of: fluoro-carbon, chloro-carbon and bromo-carbon gas; and
   irradiating the etch area removing byproducts of the irradiating step; and repeating the implanting, irradiating, and removing steps until a desired etch amount is achieved to form the semiconductor structure from the group consisting of planar gate or finFET to volatilize the etch area.

2. The method of claim 1, wherein the reactive species includes a selected one of the group consisting of: fluorine (F), chlorine (Cl), nitrogen tri-flouride ($NF_3$), sulfur hexa-fluoride ($SF_6$), hydrogen (H) and boron tri-fluoride ($BF_3$).

3. The method of claim 1, wherein the implanting step includes implanting to a depth of no greater than approximately 50 Å.

4. The method of claim 1, wherein the irradiating step includes exposing the etch area to a laser.

5. The method of claim 4, wherein the laser has a wavelength of approximately 193 nm, and a dose value of no less than approximately 50 $mj/cm^2$ and no greater than approximately 5000 $mj/cm^2$.

6. The method of claim 1, wherein the implanting step occurs in the presence of a gas including argon (Ar) and a selected one of the group consisting of: fluoro-carbon, chloro-carbon and bromo-carbon gas.

7. The method of claim 1, wherein a material of the substrate to be etched includes one of the group consisting of tungsten (W), rhenium (Re), silicon (Si), germanium (Ge), silicon-germanium (SiGe), tungsten silicide ($WSi_2$), polycrystalline silicon, tantalum nitride (TaN) and ruthenium (Ru).

8. The method of claim 1, wherein in the case that the structure is a planar gate, the mask has a thickness of no less than approximately 5 nm and no greater than approximately 100 Mn.

9. The method of claim 1, wherein in the case that the structure is a fin structure of a finFET, the mask has a thickness of no less than approximately 100 nm and no greater than approximately 200 nm.

* * * * *